United States Patent [19]

Myer et al.

[11] 4,239,312
[45] Dec. 16, 1980

[54] PARALLEL INTERCONNECT FOR PLANAR ARRAYS

[75] Inventors: Jon H. Myer, Woodland Hills; Jan Grinberg, Los Angeles, both of Calif.

[73] Assignee: Hughes Aircraft Company, Culver City, Calif.

[21] Appl. No.: 964,550

[22] Filed: Nov. 29, 1978

[51] Int. Cl.³ .............................................. H05K 1/08
[52] U.S. Cl. ................................. 339/17 N; 339/49 B
[58] Field of Search .......... 339/17 CF, 17 M, 17 LM, 339/17 N, 18 R, 18 C, 48, 49 B, 252 R, 254 R, 254 M; 361/412

[56] References Cited
U.S. PATENT DOCUMENTS

| 640,478 | 1/1900 | Metcalf | 339/48 |
|---|---|---|---|
| 2,948,875 | 8/1960 | Batcheller | 339/48 |
| 3,071,843 | 1/1963 | Horton | 361/412 |
| 4,045,107 | 8/1977 | Sutherland | 339/49 B |

OTHER PUBLICATIONS

IBM Tech. Discl. Bulletin, Schneider, vol. 7, No. 4, p. 331, 9-1964.
IBM Bulletin, Roche, vol. 5, No. 11, p. 14, 4-1963.
IBM Bulletin, Essert, vol. 7, No. 10, p. 873, 3-1965.
IBM Bulletin, Miller, vol. 8, No. 3, p. 380, 8-1965.
IBM Bulletin, Beverly, vol. 8, No. 10, p. 1325.

*Primary Examiner*—Neil Abrams
*Attorney, Agent, or Firm*—Lewis B. Sternfels; W. H. MacAllister

[57] ABSTRACT

A large scale parallel architecture in which many parallel channels numbering $10^2$ or more operate simultaneously to create a natural and efficient organization for processing two-dimensional arrays of data. The architecture comprises a plurality of stacked integrated circuit wafers having top and bottom surfaces, electric signal paths extending through each of the wafers between the surfaces, and micro-interconnects (smaller than 50 mil) on the surfaces of adjacent wafers interconnecting the respective electric signal paths with a topographical one-to-one correspondence.

7 Claims, 14 Drawing Figures

PARALLEL INTERCONNECT FOR PLANAR ARRAYS

BACKGROUND OF THE INVENTION

1. Field of the Invention

The present invention relates to micro-interconnects and, in particular, to such micro-interconnects useful in a three-dimensional micro-electronic device structure in which formation is transferred through stacked wafers interconnected with adjacent wafers with topological one-to-one correspondence.

2. Description of the Prior Art Including Prior Art Statements

Rapid advances in the science and technology of micro-electronics have led to a rapid growth in the power of digital computers, for example, in their ability to calculate and process data. Even so, in recent years the increasing need for processing two-dimensionally organized data has out-striped the power of the electronic digital computer in several important areas of application. These applications mainly involve near real-time machine processing of video, and wideband signals from radar or digitized infrared imagery, and solving multi-dimensional, non-linear parallel differential equations governing such physical systems are meteorology and aero-dynamics. For example, the enormous quantity of information on a single continuous-tone high-resolution photograph challenges the capabilities of even the larger-present-day electronic digital computers. As a result, near real-time analysis of the multi-image input from video or infrared imaging systems exceeds the capabilities of conventional serially organized electronic digital computers.

Elements of present-day electronic digital computers transfer information through leads on a surface of a chip or a wafer to its edge and then through external leads to another wafer. Such interconnections limit the number of channels of information, and result in very large physical size and power consumption with associated heat removal problems, high price, and relatively long interconnections. For example, this type of architecture precludes the use of low power logic, which is too slow to be used in serially structured machines for high data rate applications. Power requirements are relatively high, also because the high frequency, long lines have to be low impedance (50 ohm) matched transmission cables. The resultant system size is large because of its requirements for printed boards, connector cables, packages and the like. The price is high because of the high labor content of fabrication of and interconnections within printed circuit boards and packaging of the chips.

SUMMARY OF THE INVENTION

The present invention avoids or overcomes the above problems by utilizing micro-interconnects which are useful and capable in transferring information between planar structures, for example, stacked wafers, each of which is interconnected to its adjacent wafer with topological one-to-one correspondence. Such micro-interconnects are equally adaptable to the general art of interconnecting integrated circuit chips and the like.

It is, therefore, an object of the present invention to provide a means for simple electrical coupling of planar arrays.

A further object of the present invention to provide a means by which massive parallel computing channels ($10^2$ or more) can be effected.

Another object of the present invention is to provide for equivalent processing throughput which is 100 times higher than the fastest pipeline processors presently known.

A further object of the present invention is to provide for significantly lower dissipated power than present computing devices.

Another object of the present invention is to permit the use of low power logic.

Still another object of the invention is to permit the use of high impedance, e.g. 10 kilo-ohms, short lines of less than one inch, for example, as compared to 50 ohms on conventional high speed computers.

Another object of the invention is to provide for smaller sizes, e.g. 100 times smaller, than present computers.

Another object of the present invention is to reduce the cost of micro electronic devices by reducing their labor content.

Other aims and objects as well as a more complete understanding of the present invention will appear from the following explanation of the exemplary embodiments and the accompanying drawings thereof.

DESCRIPTION OF THE PREFERRED EMBODIMENT

The present invention was developed primarily for use in constructing microelectronic computers, to meet one of the most pressing needs in rapid data processing, i.e., the processing of two-dimensionally organized information.

Such use, as applied to digital computing, is intended to reorganize the electronic digital processor from serial to parallel architecture. In the new computer, many parallel channels, $10^2$ or more, operate simultaneously on the data. This organization is more natural, and therefore more efficient, for processing two-dimensional array data. To organize a digital computer in parallel, micro-electronic wafers or chips, which are densely packed with circuits must be interconnected. Because each wafer requires a large number of connecting leads, the wafers are stacked against each other and the leads are interconnected from adjacent wafers with topological one-to-one correspondence.

Figure 1:
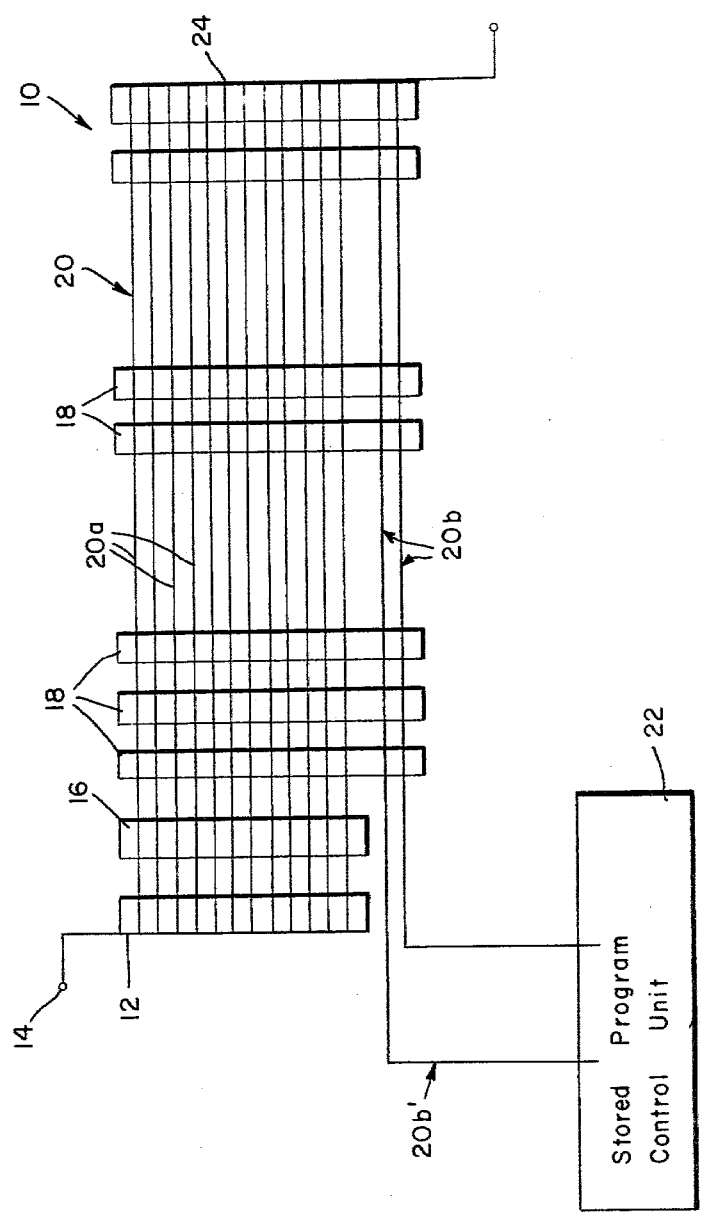
FIG. 1 is a view of an embodiment of the preferred device in which the present invention is used, depicting a basic block diagram of a three-dimensional micro electronic computer.

A basic block diagram of a typical system is shown in FIG. 1 as a computer 10. An input wafer 12 is, for example, a charge coupled serial-parallel CCD array which accepts serial electrical analog signals from input 14. An analog to digital converter 16 converts the signal which is then supplied to a stack of logic wafers 18. Conductor lines 20 extend through all the wafers and comprise data, address and control bus lines. In this typical system, data lines 20a can number $10^2$ to $10^6$, for example, and only relatively few (10 or so) serve address and control function as shown by 20b, for example.

A stored program control unit 22 performs the control function and, stores the software program. The software program consists of address and control commands. The program counter, included in the control unit, reads out the appropriate address and control information into the address and control bus lines. The address line 20b' addresses typically two wafers simultaneously, one from which the information is read out and the one to which the information is written in. The control command determines the mode of operation of the written-in wafer. After the information has been processed on the wafer, it is similarly transferred to another wafer for processing or storage and so on. Each wafer is considered to be an independent station that can be addressed by means of the address lines. The N×N information array is transferred and processed in parallel. An output wafer 24 serves as a serial, digital input/output element. Processed information is read out through this element. This unit is also useful for local processing control. A mask of information can be introduced this unit, and then the mask can be transferred to any wafer by the bus lines. In this manner one can, for example, carry out locally different processing on different parts of the array information.

The output of the serial input/output unit can be transferred to a process evaluation unit (not shown in FIG. 1). This unit evaluates the process output and modifies the program stored in the control unit accordingly, or inytroduces a modified mask into the processor. In this case, there is a digital feed back system which in near real-time modifies the programming according to image and evaluation data.

The use of massive parallel organization and storage of the entire image on the wafer eliminates memory cycling and increases the computational speed of this system.

The illustrated system has been compared to the faster digital computers utilizing semi-conductor memory. It is assumed words will be processed in parallel, the bits in a word will be processed serially. For 10 MHz clock rates for the three-dimensional computer, the system advantage for two-dimensional information analysis is high data-rate processing capability (ten to one hundred times faster), low power (ten to one hundred times faster), high computation capability, and small weight and volume (ten to one thousand times faster). These features are mutually exclusive with present computer technology.

Processing speeds in excess of $10^9$ instructions per per second are required in typical applications for high altitudes surveillance, navigation, target identification or cueing, and tracking by model matching. Present computers cannot meet this requirement and appear unlikely to be able to come close to this speed in the foreseeable future. The extensive parallelism of the present invention can provide the required throughput ($10^{10}$ instructions per second or more).

There are two basic requirements for implementing the three-dimensional computer system. It requires a feed through of electrical signals from one side of the wafer to the other while preserving the spatial modulation of the signal. It must be fast and work equally well in both directions, and must provide a means of interconnecting the wafers in a stack.

While it is possible to etch holes through wafers to overcoat the holes with an insulating layer and plate conductive materials on the wall of the bore of holes, the preferable approach employs thermomigration technology, as depicted in FIG. 2, to transfer the electrical signal from one side of the wafer to the other.

Prior work in other laboratories has shown the effects of thermomigration. Thermomigration is the phenomenon of a liquid zone in the form of a droplet, a sheet, or a rod migrating in a solid along a thermal gradient. The thermomigration of liquid droplets in solids can be understood as follows. A liquid droplet is embedded in a solid subjected to a thermal gradient. This thermal gradient causes the temperature on the forward droplet interface to be higher than the temperature on the rear droplet interface. Since the solubility of a solid in a liquid increases with temperature, the concentration of dissolved solid atoms is higher in the liquid at the hotter forward interface of the droplet than in the liquid at the cooler rear interface of the droplet. This inequality in concentration produces a concentration gradient of dissolved solid atoms across the liquid droplet. This concentration gradient, in turn, generates a flux of dissolved solid atoms down the concentration gradient from the front to the rear interface of the liquid droplet. To feed this diffusion flux, additional solid atoms dissolve into the liquid at the forward hot face of the droplet while dissolved solid atoms deposit on the cold rear face of the droplet. As a consequence, the liquid droplet moves forward up the thermal gradient in the solid by dissolving the solid at its front, passing the atoms or molecules of the solid through itself to its rear, and redepositing these atoms behind itself.

This dissolution process was used to form one device of present invention utilizing liquid-aluminum droplets migrating up a thermal gradient in a crystal of n-type silicon. The liquid droplets migrated as explained above: solid silicon dissolved into the liquid aluminum at the forward, hotter interface of the droplet, the dissolved silicon atoms were transported through the intervening liquid, and the same silicon atoms were redeposited on the rear, cooler interface of the liquid aluminum droplet. At the rear face of the droplet, trace amounts of aluminum up to the solid solubility limit of aluminum in solid silicon at the migration temperature were incorporated in the redeposited silicon. The dissolved aluminum atoms doped the redeposited silicon in the trail behind the droplet with a p-type conductivity, thereby forming a highly conductive channel which is insulated from the bulk by a p-n junction.

Such wafer feedthroughs are based on developments by Thomas R. Anthony and Harvey E. Cline of the General Electric Company. Known patents of these two parties include U.S. Pat. Nos. 3,895,967; 3,898,106; 3,899,361; 3,899,362; 3,901,736; 3,902,925; and 3,904,442, all dated in the months of July–September, 1975. Publications include the following: Journal of Applied Physics, Vol. 43, No. 11, November 1972 pages 4391–4395; IEEE Transactions on Electron Devices, Vol. ED-23, No. 8, August 1976, pages 818–823; Journal of Applied Physics, Vol. 47, No. 6, June 1976, pages 2316–2336 and 2550–2557; Journal of Applied Physics, Vol. 48, No. 6 June 1977, pages 2196–2201; Applied Physics Letters, Vol. 31, No. 2, 15 July 1977, pages 125–126; and Journal of Applied Physics, Vol. 48, No. 9, September 1977, pages 3943–3949.

The specific experimental setup used for thermomigration processing and the important physical parameters of the process such as thermomigration temperature, droplet size, effect of crystallographic orientation, random walk displacement, and required thermal gradient are as follows.

Figure 2A:
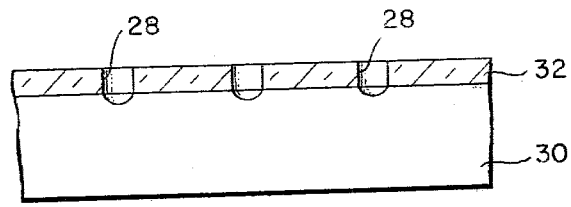
FIGS. 2a-2e illustrates one means by which a signal is feed through a wafer by using thermomigration technology.
Figure 2B:
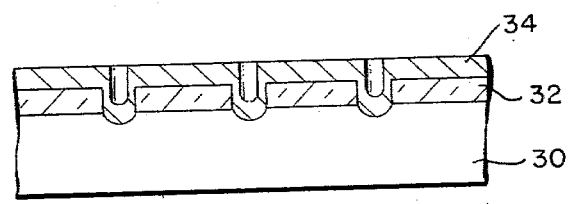
Figure 2C:
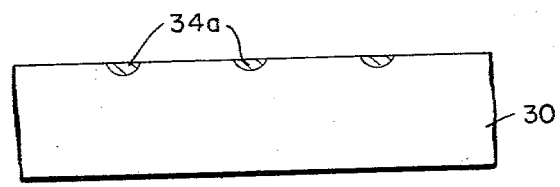
Figure 2D:
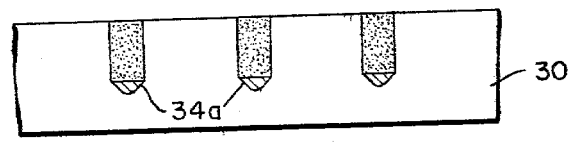
Figure 2E:
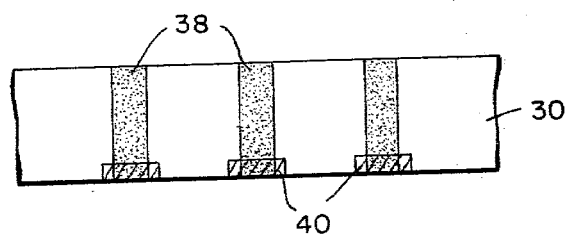

The basic processing sequence of thermomigration for the implementation of bus lines through a thin silicon wafer is illustrated in FIGS. 2a–2e. First, by using conventional photolithography and etching techniques, an array of holes 28 through a layer 32 of silicon dioxide (10 to 25 $\mu$m deep) was etched into a n-type silicon wafer 30 (FIG. 2). These holes were used to prevent the subsequent liquid zones from moving laterally on the silicon surface, and thus serve to preserve the registration and pattern of the deposited array. Next, the wafer was placed in the chamber of a metal evaporator where a layer of aluminum 34 was deposited (FIG. 2b). The thickness of this aluminum layer is preferably approximately equal to the depth of the etched holes (FIGS. 2). Next, excess aluminum was removed by grinding (FIG. 2c). The array of 34a of aluminum dots, half buried in the surface of the silicon, was then ready for thermomigration processing (FIG. 2d).

A slight modification of this process is presently preferred. The steps depicted in FIGS. 2a and 2b have been eliminated. Instead, aluminum dots are placed on a base silicon wafer using standard lithographic techniques. No holes are etched.

The wafer was placed in an electron beam thermomigration apparatus, which was designed to produce a very uniform vertical temperature gradient. The radiation block was made of molybdenum, which is heated by an incident electron-beam. Radiation from the hot molybdenum block produces uniform heating of one face of the silicon wafer to a temperature of 1000° to 1200° C. The wafer was suspended in a vacuum of $5 \times 10^{-6}$ Torr and seated in a silicon sample holder. The aluminum-evaporated side of the wafer faced the water-cooled copper block. A temperature gradient of 10° to 100° C./cm was maintained between the two surfaces of the silicon bulk. Cylindrical radiation shields around the sample prevented unwanted radial gradients from developing in the wafer. It is also presently preferred that, instead of using the vacuum thermomigration system, a silicon epireactor with helium or nitrogen cooling gas be utilized. As shown in FIG. 2d, the buried aluminum melted and alloyed with the silicon and then migrated up the thermal gradient, leaving behind an array 38 of heavily doped regions of p-type silicon forming the desired feedthrough part of the bus line. P-type dots were then diffused as spots 40 at the end of feedthrough lines 38. These dots 40 are sufficiently large to make contact with feedthroughs 38, which exhibit some random, rather than straight-line, migration through the wafer.

The fabrication of chip interconnections is the second major technological development required for the 3-dimensional computer. The very large number of contacts ($10^4$ to $10^8$) imposes the need for high reliability and small contact dimensions. Also, any proposed interconnection technique must be compatible with wafers that are somewhat distorted. The concept of a bus that passes through all wafers in the stack requires that the contacts have low capacitance, have low resistivity, and be independent of polarity and orientation.

The invention, as depicted in FIGS. 3–8, uses spring contacts, and is an outgrowth of the technology for the fabrication of miniature audio frequency tuning forks and beam lead crossovers. These crossover-type spring contacts are fabricated so that the height of the tunnel underneath is sufficient to accomodate for the distortion across a wafer and permit complete interconnection of all the contacts in parallel. The contacts may be batch-fabricated by either electroplating or vacuum evaporation, and the process is compatible with silicon technology.

Figure 3:
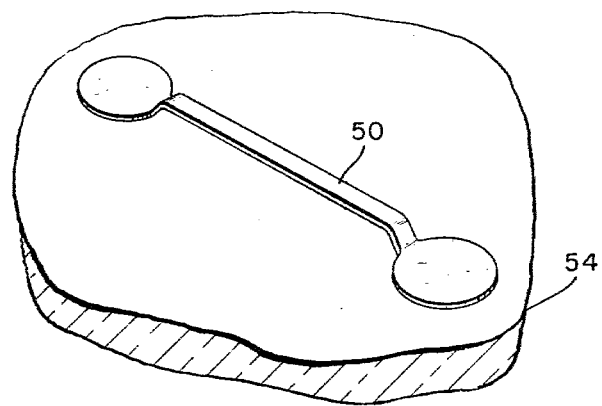
FIGS. 3-5 depict one means by which interconnections between wafers may be made with topological one-to-one correspondence by use of the present invention.
Figure 4:
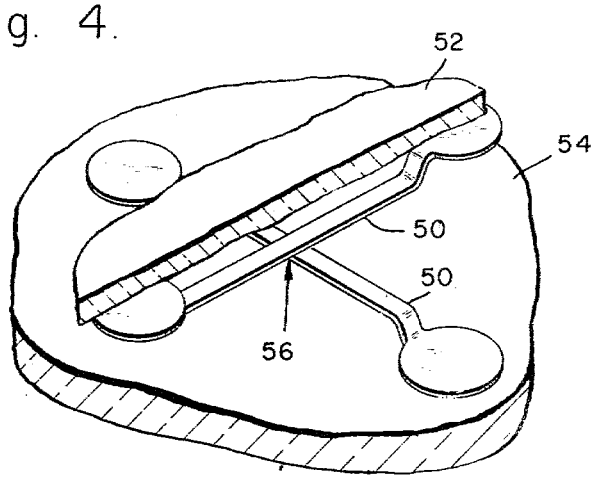
Figure 5:
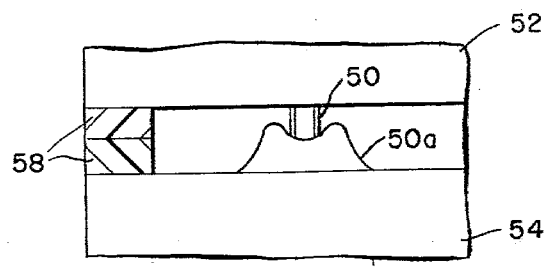
Figure 6:
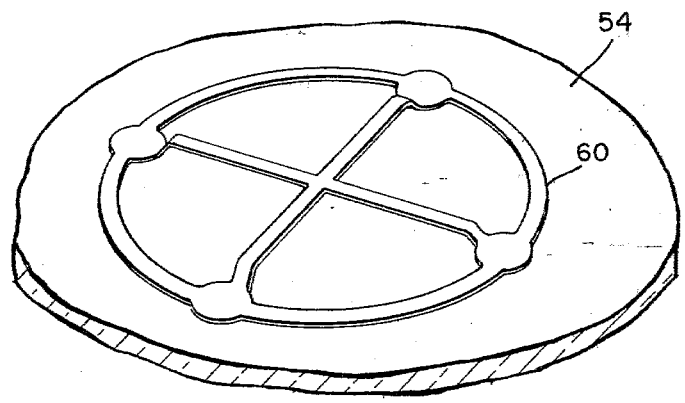
FIGS. 6 and 7 illustrate a modification of the interconnection means shown in FIGS. 3-5.
Figure 7:
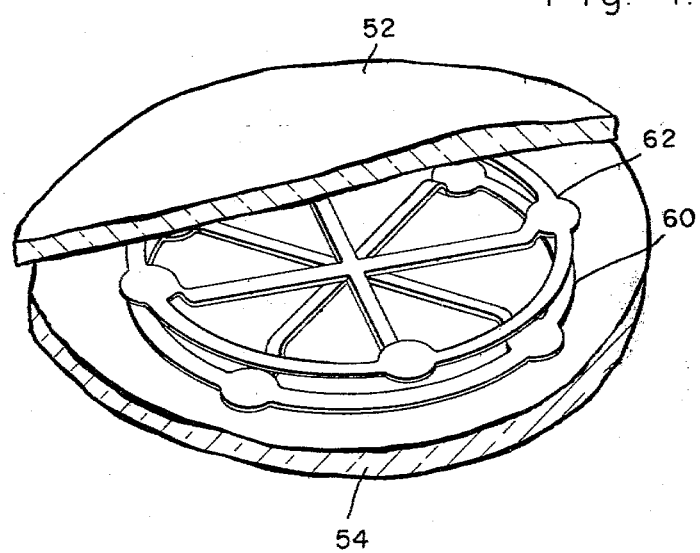

The basic structure of a spring contact 50 is shown in FIG. 3. When fabricated on silicon chips, the contact on one chip is oriented at right angles to the contact on the other chip. Thus, when juxtaposed wafers 52 and 54 are mated, the springs make contact at right angles, as shown in FIG. 4, forming a cross 56. This juxtaposition increases the probability of contact and ensures a more secure interconnection. Also, this arrangement accomodates maximum chip displacement while occupying minimum space on the silicon chip. This design satisfies the need for reliable miniature contacts, even when the chips are distorted. Another advantage of this type of contact is that the stack may be disassembled and the individual chips demounted. If desired, spacers 58 (FIG. 5) of photoresist, for example, may be secured to and between adjacent wafers 52 and 54 to limit spring deformation and prevent crossing contacts from being squashed. Greater numbers of contacts may be used, as illustrated in FIGS. 6 and 7, showing contact structures 60 and 62.

Figures 8A, 8B, 8C:
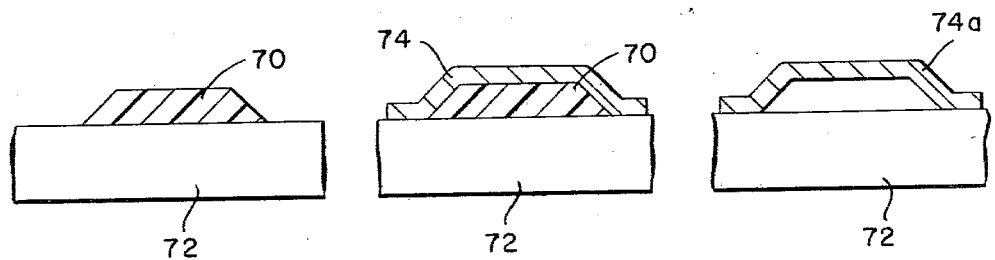
FIGS. 8a-8c illustrate means by which the interconnections, embodied as microsprings, may be fabricated.

The spring-contact concept originated in the technology for producing miniature tuning forks (tunistors) and resonant gate transistors used in monolithic audio oscillators. A similar technology, known as the beam-lead crossover, was also developed at about the same time. The basic fabrication process is the same in each case. The principal steps are shown in FIGS. 8a–8c. First, a spacer 70 10 $\mu$M or more thick is evaporated or electroplated onto a substrate 72 (FIG. 8a). Then the spring contact 74 is evaporated or electroplated on top of the spacer (FIG. 8). Finally, the spacer is etched away, and a flexible microspring bridge 74a results (FIG. 8). To secure the contact between two microsprings, each microspring is also coated with a thin layer of indium. During the assembly of the wafer stack, the wafers are heated to near the melting point of indium and the two microsprings will be bonded.

Although the invention has been described with reference to particular embodiments thereof, it should be realized that various changes and modifications may be made therein without departing from the spirit and scope of the invention.

What is claimed is:

1. For use in electrically interconnecting a plurality of stacked integrated circuit wafers, each having top and bottom surfaces, and through which electric signal paths extend between the surfaces, a microinterconnect comprising first and second metallic microspring bridges electrically connected respectively to said signal paths and respectively secured at their ends to the surfaces of their respective wafers with their central portions spaced from said wafer surfaces to impart a yieldable spring characteristic to said bridges, said bridges on said surfaces of adjacent wafers facing one another and being in resilient contact for electrically coupling said wafers .

2. The electrical interconnect according to claim 1 in which the mutual contact of said bridges comprises a crossing thereof.

3. The electrical interconnect according to claim 2 in which each of said central portions of said bridges comprise at least a pair of crossing arms secured together at their crossing points.

4. The electrical interconnect according to claim 3 further including spacer material disposed between said wafers for preventing said bridges from being deleteriously squashed together beyond their elastic limits.

5. The electrical interconnect according to claim 2 in which said electric signal paths comprise data bus lines penetrating said wafers and interconnecting individual electronic functions of said wafers into a larger electronic function and in which the individual electronic functions comprise two-dimensionally arrayed computing cells and said data bus lines comprise $10^2$ to $10^6$ channels operating simultaneously on the data for processing thereof, the further improvement in that bridges are paired in an equivalent $10^2$ to $10^6$ number.

6. The electrical interconnect according to claim 5 in which said bridges are smaller than 50 mil.

7. The electrical interconnect according to claim 2 in which said electrical signal paths extend between the surfaces with a topological one-to-one correspondence from wafer to wafer, and said microspring bridges electrically couple said wafers in the topological one-to-one correspondence.

* * * * *